United States Patent [19]
Yoshioka et al.

[11] Patent Number: 6,034,346
[45] Date of Patent: Mar. 7, 2000

[54] METHOD AND APPARATUS FOR PLASMA PROCESSING APPARATUS

[75] Inventors: Ken Yoshioka; Saburou Kanai, both of Hikari; Tetsunori Kaji, Tokuyama; Ryoji Nishio, Kudamatsu; Manabu Edamura, Ibaraki, all of Japan

[73] Assignee: Hitachi, Ltd., Tokyo, Japan

[21] Appl. No.: 08/649,190

[22] Filed: May 17, 1996

[30] Foreign Application Priority Data

May 19, 1995 [JP] Japan .................................. 7-120992
Aug. 8, 1995 [JP] Japan .................................. 7-202016

[51] Int. Cl.[7] .................................................. B23K 10/00
[52] U.S. Cl. ............................... 219/121.43; 219/121.41; 204/298.37; 204/298.38; 156/345; 118/723 MW
[58] Field of Search .................. 219/121.43, 121.41, 219/121.59; 204/298.37, 298.38, 298.19, 298.18; 156/345, 643.1, 646.1; 118/723 MW

[56] References Cited

U.S. PATENT DOCUMENTS

| | | | |
|---|---|---|---|
| 5,003,152 | 3/1991 | Matsuo et al. | 219/121.59 |
| 5,024,716 | 6/1991 | Sato . | |
| 5,034,086 | 7/1991 | Sato | 156/345 |
| 5,134,965 | 8/1992 | Tokuda et al. . | |
| 5,202,095 | 4/1993 | Houchin et al. | 422/186 |
| 5,245,157 | 9/1993 | Ohiwa | 219/121.43 |
| 5,280,154 | 1/1994 | Cuomo et al. | 219/121.52 |
| 5,321,222 | 6/1994 | Bible et al. . | |
| 5,478,459 | 12/1995 | Latz | 204/298.38 |
| 5,480,533 | 1/1996 | Yoshida | 204/298.38 |
| 5,717,294 | 2/1998 | Sakai et al. | 315/111.41 |

FOREIGN PATENT DOCUMENTS

| | | |
|---|---|---|
| 0 357 824 A1 | 3/1990 | European Pat. Off. . |
| 0 468 886 A2 | 1/1992 | European Pat. Off. . |
| 41 18 973 A1 | 12/1992 | Germany . |
| 3-79025 | 4/1991 | Japan . |
| 4-358077 | 12/1992 | Japan . |
| 6-112161 | 4/1994 | Japan . |
| 7-022397 | 1/1995 | Japan . |

OTHER PUBLICATIONS

The Japan Society of Applied Physics, 1994, Autumn, 19p–ZV–4.

The Japan Society of Applied Physics, 1994, Autumn, 19p–ZV–6.

"Free Radicals is an Inductively Coupled Etching Plasma", Y. Hikosaka et al, Japan J. Appl. Phys., vol. 33, 1994, pp. 2157–2163.

*Primary Examiner*—Mark Paschall
*Attorney, Agent, or Firm*—Antonelli, Terry, Stout & Kraus, LLP

[57] ABSTRACT

An electromagnetically coupled plasma processing apparatus is arranged so that a microwave sent through a coaxial waveguide is enlarged by a parallel disk waveguide before being radiated from an enlarged coaxial portion. The electromagnetically coupled plasma processing apparatus has a loop antenna for passing a high-frequency wave, a cavity resonator for surrounding the loop antenna, and a slit in double-layer structure in a position where the cavity resonator faces a plasma. The plasma on the surface of a wafer can be processed uniformly with various desirable effects including: (1) preventing foreign matter from being produced and abnormal discharge because of electrostatic coupling; (2) improving the ignitability and stability of a plasma; (3) lowering the antenna voltage; and (4) effecting uniform processing by providing an opposed grounding electrode.

11 Claims, 11 Drawing Sheets

X-DIRECTION POSITION (mm)
UNIT OF CONTOUR LINE ; mA/cm²

FIG. 4(b)

X-DIRECTION POSITION (mm)
UNIT OF CONTOUR LINE ; mA/cm²

METHOD AND APPARATUS FOR PLASMA PROCESSING APPARATUS

BACKGROUND OF THE INVENTION

The present invention relates to plasma processing methods and apparatus, and more particularly to a plasma processing method and apparatus fit for processing a specimen, such as a semiconductor substrate (hereinafter called a "wafer"), by generating a plasma using a microwave and a high-frequency wave in the frequency range of 10 to 100 MHz.

In the case of apparatus in general for generating a plasma by introducing a microwave into a process chamber, the uniformity of plasma density distribution above a wafer surface to be treated is particularly important in securing a desired uniformity of processing, such as etching. In order to deal with this problem, there has been proposed a method of radiating a microwave in a ring-like shape from the top surface of a process chamber to generate a ring-shaped plasma, so that uniform plasma distribution is obtained on the surface of a wafer, as mentioned in, for example, Document A, "The Japan Society of Applied Physics, 1994, Autumn, 19p-ZV-4" or Document B, "The Japan Society of Applied Physics, 1994, Autumn, 19pZV-6." This is because the plasma tends to diffuse as it is moved from its originating place in the direction of the wafer. Although a desired uniformity of the etching rate itself is ultimately required, it may be desirable for the apparatus also to have a density distribution adjusting means, since the plasma density distribution is concave or convex, rather than a uniform distribution.

Moreover, another means for generating a ring-shaped plasma is described in, for example, Japanese Patent Laid-Open No. 112161/1994.

On the other hand, an inductively coupled RF (high frequency) plasma source as representatively disclosed in Japanese Patent Laid-Open No. 79025/1991, has been in frequent use recently as a plasma source for CVD and etching. This plasma source has made possible not only a high density ($10^{11}$–$10^{12}$ cm$^{-3}$) but also a low-pressure (1–10 mTorr) action equivalent to what is offered by a microwave ECR plasma source, though it is compact in construction. Even in this system, however, it is still required to provide a definite means for securing a desired plasma uniformity and to solve a problem arising from foreign matter produced by wall-surface sputtering, which will be described below, as in the case where a microwave is used.

First, a description will be given of a problem concerning microwave plasma uniformity herein. The ring-shaped plasma radiation means according to the above-described Documents A and B has been arranged so that it is fit for use in producing a uniform plasma, but the ultimate plasma density thus attained thereby remains at a low level, such as 3–10×$10^{10}$ cm$^{-3}$ and still fails to reach the following level which is industrially required 3–$10^{-11}$ cm$^{-3}$ or greater.

This is considered attributable to the fact that, in both the cases mentioned above, the absorption efficiency of a microwave has not been optimized, because a local magnetic field produced by a permanent magnet is employed at an outlet for the microwave, nor has the design of a microwave transmission path for large electrical power to be transmitted. According to the above-referenced Document A, the introduction of a complicated three-dimensional structure into the plasma processing chamber may cause foreign matter to be produced. Japanese Patent Laid-Open No. 112161/1994 describes an arrangement in which a coaxial waveguide is opened in a tapered shape, which results in rendering a microwave radiating portion large-sized.

A description will subsequently be given of a problem concerning plasma uniformization and foreign matter control in the case of a high-frequency wave.

The aforementioned system (Japanese Patent Laid-Open No. 79025/1991) has presented problems, including the need for the inner surface of a vacuum chamber to be scraped down as a result of sputtering due to ion bombardment, thus increasing not only the production of foreign matter, but also increasing the frequency at which parts need to be replaced in the vacuum chamber; and, in addition, there is lowering of the plasma uniformity as the plasma tends to concentrate at the center of the chamber and so forth.

In this case, the induction coil placed outside the vacuum chamber undergoes partial electrostatic coupling with the plasma, rather than the intended inductive coupling therewith, and ions are accelerated by this electrostatic coupling toward the inner surface of the vacuum chamber, whereby the sputtering of the inner surface is said to occur. Consequently, an attempt was made to remove the electrostatically coupled component by introducing an electrostatic shield, called a Faraday shield, between the induction coil and the vacuum chamber so as to suppress the sputtering. However, the effect of this arrangement is not perfect and there still remains a scraping problem because of the sputtering: (e.g., Y. Hikosaka et al., "Free Radicals in an Inductively Coupled Etching Plasma," Jpn. J. Appl. Phys. Vol 133 (1994) pp 2,157–2,163 Part 1. No. 4B, April 1994).

In the system disclosed in Japanese Patent Laid-Open No. 79025/1991, further, a plasma generating area over the whole top surface of the chamber and the aforementioned plasma diffusion effect have been combined to cause the plasma to be centralized.

Moreover, another problem pertaining to the plasma processing apparatus (Japanese Patent Laid-Open No. 79025/1991) has arisen from the ignitability and stability of plasma. When the induction system is used to ignite a plasma, it is necessary to form the top surface of the process chamber with dielectric material so as to introduce the magnetic flux generated by the induction coil into the process chamber. For this reason, the thickness of the dielectric material needs to be increased (i.e., in order to have vacuum force maintained), which results in sharply worsening ignitability and stability of the plasma as the distance between the induction coil and the top surface of the plasma is increased.

A third problem is concerned with the fact that the structure makes it difficult to have a grounding electrode set in parallel and opposite to a specimen, since a thick dielectric material has to be employed. Although an attempt has been made to increase the processing accuracy normally by applying a high-frequency bias to a specimen-holding stage in the case of an etcher or CVD, the processing tends to lack uniformity in the absence of such a grounding electrode positioned in parallel and opposite to the specimen; that is, in a case where the grounding electrode is positioned on the side wall of the chamber, the length of the high-frequency bias circuit portion which is allowed to pass through the plasma differs between the center of the wafer and the outer periphery of the wafer. Thus, the bias is unevenly applied to the wafer, and, especially when the wafer has a large diameter (8→12 inches), this problem becomes conspicuous.

A fourth problem originates from a variety of bad effects, including an abnormal discharge resulting from the high input impedance of the induction RF coil, which makes the power supply terminal have a high voltage, an unstable discharge resulting from sputtering and improper matching as electrostatically coupled components go on increasing, an impediment to the ignitability and so on.

SUMMARY OF THE INVENTION

An object of the present invention is to provide a plasma processing method and apparatus, which is capable of generating a high-density plasma at an industrially required level by generating a uniform plasma and simultaneously transmitting large electric power through compact, ring-shaped microwave radiation means and of adjusting the uniformity on a wafer surface.

Another object of the present invention is to provide a plasma processing method and apparatus so configured as to prevent any foreign matter from being produced in a process chamber and which is capable of adjusting uniformity on a wafer surface; and more particularly to provide an electromagnetically coupled plasma processing apparatus based on a novel principle according to which the following four problems, associated with a high-frequency plasma, can be solved simultaneously or partially:

(1) improvement of sputtering reliability by removing electrostatically coupled components;

(2) setting of a plasma close to an RF antenna;

(3) installation of an opposed grounding electrode; and (4) lowering of coil impedance.

To achieve the above objects, during plasma processing of a specimen, the density distribution of the plasma is independently controlled.

Preferably, the density distribution of the plasma is independently controlled by a position adjustment of an ECR or a magnetic field gradient.

Further, preferably, the density distribution of the plasma is controlled on the basis of the kind of material of the specimen.

Further, preferably, the specimen is uniformly processed by independently controlling a plasma density distribution, a gas distribution and a bias distribution.

To achieve the above objects, a plasma processing apparatus comprises a microwave introducing device, a magnetic field coil for generating a static magnetic field, a process chamber for generating a plasma using an introduced microwave, a gas supplying device for supplying a gas to the process chamber, a specimen stage for holding a wafer, and a vacuum evacuating device for evacuating the process chamber, the apparatus being characterized in that the microwave introducing device is arranged to transmit a microwave in the coaxial TEM mode.

Preferably, a plasma processing apparatus comprises a microwave introducing device, a magnetic field coil for generating a vertical static magnetic field, a process chamber for generating a plasma using an introduced microwave, a gas supplying device for supplying a gas to the process chamber, a specimen stage for holding a wafer, and a vacuum evacuating device for evacuating the process chamber, the apparatus being characterized in that the microwave introducing device is equipped with a coaxial waveguide converter, a small-diameter waveguide, a discoid parallel-plate waveguide, an enlarged coaxial waveguide and a microwave introducing vacuum window.

Preferably, $R_1$, $R_2$, $R_3$, $R_4$ and b are selected so that a small-diameter coaxial waveguide characteristic impedance $Z_0$ $(=60\ln(R_3/R_4)$, $R_3$: in-coaxial-tube conductor radius, $R_4$: out-of-coaxial-tube conductor radius) coincides with an impedance $Z_1$ $(=60b/R_3$, b: parallel disk distance) of the disk-shaped waveguide at a junction with the disk-shaped waveguide, and so that an enlarged coaxial waveguide impedance $Z_2$ $(=60\ln(R_2/R_1-)$, $R_2$: out-of-coaxial-tube conductor radius, $R_1$: in-coaxial-tube conductor radius) coincides with an impedance $Z_1$ $(=60b/R_1)$ of the disk-shaped waveguide at a junction with the disk-shaped waveguide.

Preferably, an outer diameter $R_2$ of the enlarged coaxial waveguide is smaller than an inner diameter $R_5$ of the process chamber connected to the microwave vacuum window ($R_2<R_5$).

Preferably, a microwave has a frequency between 500 MHz and 5 GHz.

Preferably, a plurality of microwave sources of different frequencies are used at the same time.

Preferably, a variable frequency microwave source is used.

Preferably, in a vacuum window portion, a plasma contact portion of the portion other than a portion ($R_1<R<R_2$) equivalent to a microwave radiating part is provided with a grounding conductor plate or a semiconductor plate, such as Si or SiC.

Preferably, a magnetic field coil or a permanent magnet is provided by utilizing a portion other than a portion ($R_1<R<R_2$) equivalent to a microwave radiating part.

Preferably, the discoid parallel-plate waveguide includes two small- and large-diameter ring-shaped opening portions and the enlarged coaxial waveguide is connected to each of the opening portions.

Preferably, the enlarged coaxial waveguides include means for varying microwave power distributed to them.

In reference to the aforesaid second object group, that is, the provision of means for securing uniformity in a high-frequency inductive plasma and for removing wall-surface sputters, an electromagnetically coupled Rf antenna system in place of an inductively coupled RF coil is employed according to the present invention. The RF antenna comprises a central conductor for letting a high-frequency current flow into a closed space surrounded with a conductor and a slit situated on one side of the closed space facing the plasma, the slit being ingeniously opened so as not to look directly at the plasma on the central conductor. The central conductor and the closed space form a cavity resonator for electromagnetically creating a resonance condition. An electromagnetic wave leaking from the cavity resonator via the slit propagates into and generates the plasma. Such an electromagnetic coupling system using a resonant cavity makes it possible to obviate completely and theoretically the generation of an electrostatically coupled component commonly observed in the prior art and to solve the problem of sputtering and wall scraping, for example. At the same time, a construction so designed so as to solve the four problems enumerated previously can be attained through this coupling system.

Preferably, the antenna system is to be installed not beyond but on this side of a dielectric window constituting a vacuum chamber.

Preferably, a slit conductor is potentially switchable from floating to a grounding potential and vice versa.

A plasma generation area will be located directly below a ring radiation source and a ring-shaped plasma will be generated if a microwave in a coaxial ring-like shape is radiated so as to regulate the intensity (B=875 gausses when a microwave of 2.45 GHz is employed) of a static magnetic field for use in causing electron cyclotron resonance (ECR). Since the plasma diffuses, it is evenly distributed when it is conveyed to the wafer surface.

If the intensity of microwave radiation from the respective ring-shaped sources is changed by altering the diameters of the coaxial rings or providing a double ring radiation source, the plasma uniformity may be varied. In other words, the plasma distribution will have a heavier concentration at the center of the wafer if the intensity of the radiation is strengthened on the inner peripheral side of the double ring radiation source and a heavier concentration on the outer periphery of the wafer if the intensity is strengthened on the outer peripheral side thereof.

If an ECR position is lowered so that a microwave cannot be absorbed by a plasma immediately after the microwave leaves the ring radiator, the microwave strength distribution diffuses and is then absorbed by the plasma, so that the plasma uniformity above the wafer surface becomes variable. In other words, the uniformity can also be changed by changing the static magnetic field strength.

In accordance with the present invention, when the ring-shaped microwave radiating source is installed on an atmospheric side via the vacuum introducing window, the likelihood of the occurrence of foreign matter caused by the radiating source itself is eliminated.

Since the ring radiator is employed, it is possible to install a wafer-opposed electrode in the central portion of the radiator. Specifically, a conventional type of ECR microwave plasma processing apparatus has a structure in which it is difficult to install an electrode at a position opposing the wafer, so that it is difficult to apply a high-frequency bias uniformly, but the present invention makes it possible to solve this conventional problem. In the central portion, it is possible to install a gas pipe for discharging a processing gas or a member for absorbing the excess radicals contained in a processing plasma (for example, a Si plate scavenger for fluorine radicals).

If the microwave radiating source is installed at a position spaced away from the inner side wall of the plasma processing chamber, the plasma generation position does not directly touch the wall, so that it is possible to keep out foreign matter due to the accumulation of high-degree dissociated radicals or prevent damage to a side wall material.

A high-frequency type plasma will subsequently be described.

First, a detailed description will be given of the principle of the aforementioned electromagnetically coupled plasma generation by reference to the drawings.

Figure 2A:
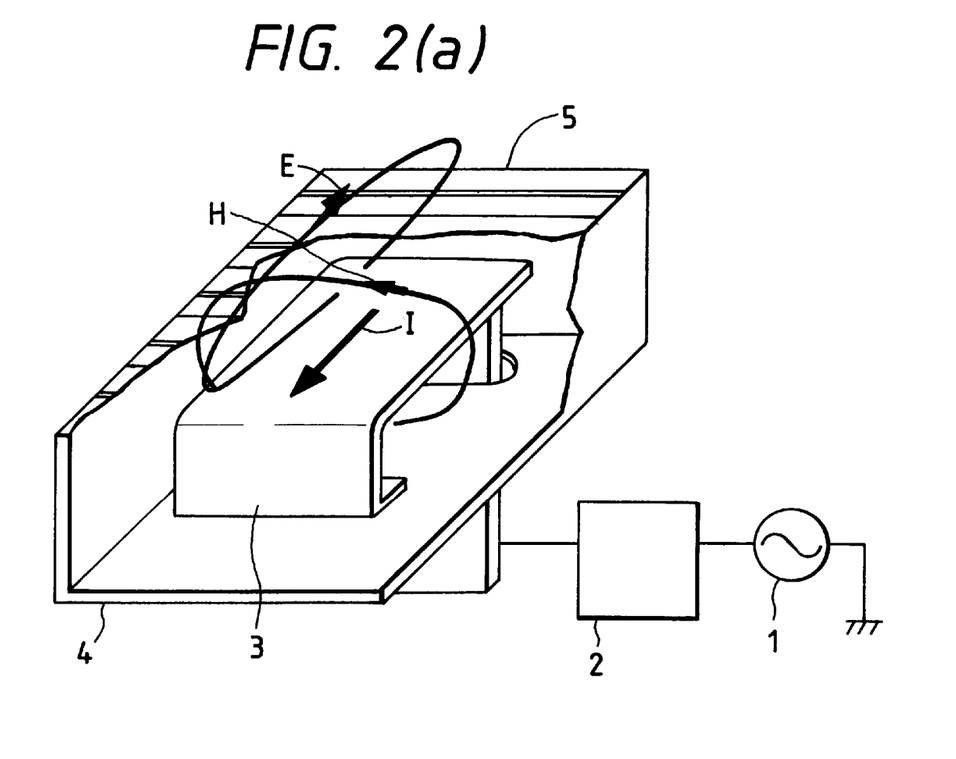
FIGS. 2(a) and 2(b) are diagrams showing the principle of the present invention.
Figure 2B:
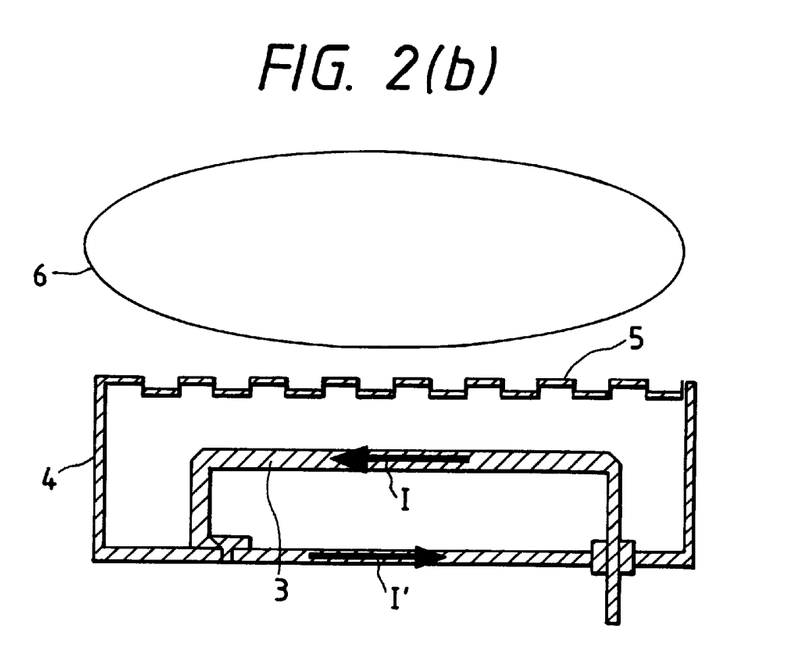

FIG. 2(a) is a diagram illustrative of the principle of the invention. As shown in FIG. 2(a), an RF power supply 1 is connected via a matching box 2 to a loop antenna body 3. The loop antenna is surrounded by a cavity resonator 4 on all sides and slits 5 are opened in only the side which faces a plasma. As shown by a vertical sectional view of FIG. 2(b), two layers of slits 5 are alternately arranged so that they are not overlapped, whereby only the electromagnetic wave components radiated from the antenna can be propagated toward a plasma without making the antenna body 3 look directly at the plasma. A detailed description will further be given of this situation. In reference to FIGS. 2(a), 2(b), it is assumed that an alternating current I is caused to flow through an antenna conductor. A return current I' passes through the side and back plates of the cavity resonator, which are screwed down with screws, on its way back. (No current flows through the slits since no flow channel is formed therein). An alternating-current magnetic field H is created by the antenna current I and the return current I', and part of the magnetic field leaks out via the slits. Because of the magnetic field that has leaked outside, a ring-shaped electromagnetic field E and other electromagnetic fields (not shown) are successively formed on a plane perpendicular to the magnetic field, in accordance with the Maxwell's law of radio-wave propagation, and are transmitted in the direction of a plasma 6. Thus only the electromagnetic wave component radiated from an antenna chamber in a closed space is coupled to the plasma according to the present invention, and a spurious component, such as an electrostatically coupled component and the like radiated from a single antenna body, is never radiated generally. As the sputtering of a structural member caused by abnormal discharge or abnormal ion acceleration is preventable, a reliable plasma source can be formed.

Another (second) advantage of the closed space structure formed by the cavity resonator is as follows: Even though a metal conductor is installed in a space other than a closed one, the radiation of the radio wave toward the plasma is not essentially affected. When a conductor plate is inadvertently placed close to the prior art induction coil, magnetic flux is blocked off at that place and the problem is that no plasma can be generated in this case. However, this problem is solvable according to the present invention; in other words, the structure according to the present invention is advantageous in that the opposed grounding electrode is readily installed.

Still another (third) advantage of the closed space structure formed by the cavity resonator is that the input impedance of an antenna is reducible. The antenna impedance of the prior art induction coil is roughly determined by the inductance L of the coil, which is turned out to be $j\omega L$ ($\omega$=angular frequency). In the closed space structure, the antenna module forms a kind of coaxial distribution constant line and the impedance is given by the following equation:

$$Z=(L+C)^{1/2}$$

C in this equation represents the capacitance between the central conductor and the inner wall of the cavity resonator, wherein C can be set greater; consequently, the impedance can be set smaller through proper structural design. Simultaneously, the value of L can be set smaller and the impedance can also be set smaller, since it is feasible to form the central conductor into a flat shape. Since this arrangement is based on a distribution constant system, the terminal impedance can be brought close to pure resistance on condition that the antenna length (effective) and the applied frequency are properly chosen, so that impedance matching is facilitated. According to the closed space structure formed by this cavity resonator, there is a further (fourth) important advantage. More specifically, the closed space structure demonstrates a definite effect resulting from securing plasma uniformity and this will be described by reference to the drawings. FIG. 3(b) shows an improved version of the prior art, which is readily presumable, wherein a method of winding the Rf coil has been changed in that peripheral winding is adopted, so as to generate a ring-shaped plasma. FIG. 3(c) refers to a cavity resonance system according to the present invention.

Figure 3A:
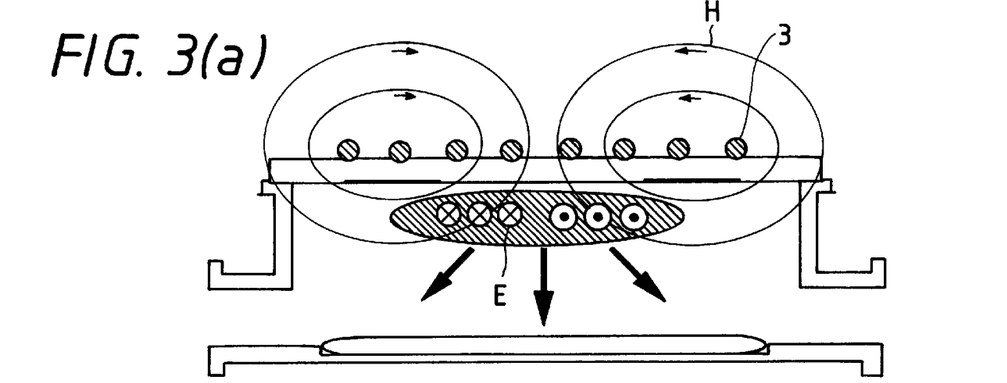
FIGS. 3(a), 3(b) and 3(c) are diagrams showing the principle of the present invention.
Figure 3B:
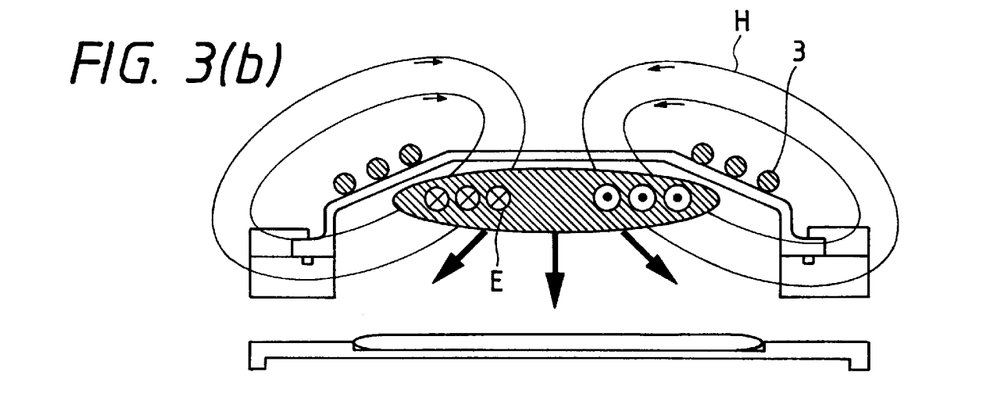
Figure 3C:
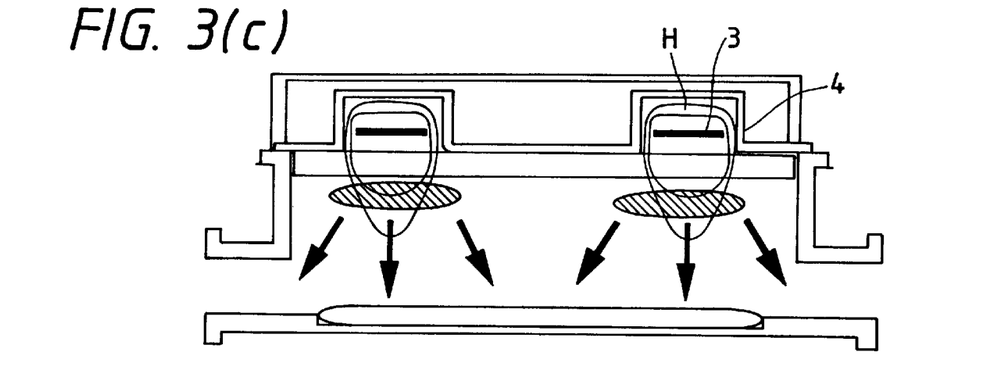

As already described, the induced electric field E formed under the electromagnetic induction law is deviated toward the center since the pattern of a magnetic line of force H generated by each induction coil 3 is also deviated toward the center according to the prior art arrangement of FIG. 3(a), so that no uniform plasma can be produced. As shown in FIG. 3(b) then, it is possible to supply current to the coils 3, which are now separated from each other but this is still unsatisfactory. Even when the coils are thus separated, the magnetic line of force H that has been formed passes through the center of the chamber, whereby a strong induced electric field E is still formed in the vicinity of the center.

The magnetic line of force formed as shown in FIG. 3(c) has a different pattern. The presence of the cavity resonator 4 surrounding an antenna conductor 3 has the magnetic line of force H confined within the cavity resonator and consequently the plasma generation area becomes ring-shaped directly below the antenna. In the course of isotropic diffusion onto the specimen wafer, the plasma is ultimately averaged and uniformized as anticipated. In other words, the cavity resonance system according to the present invention makes it possible for the first time to generate a ring-shaped plasma and irradiate a specimen uniformity with the plasma.

DETAILED DESCRIPTION OF THE PREFERRED EMBODIMENTS

Figure 1:
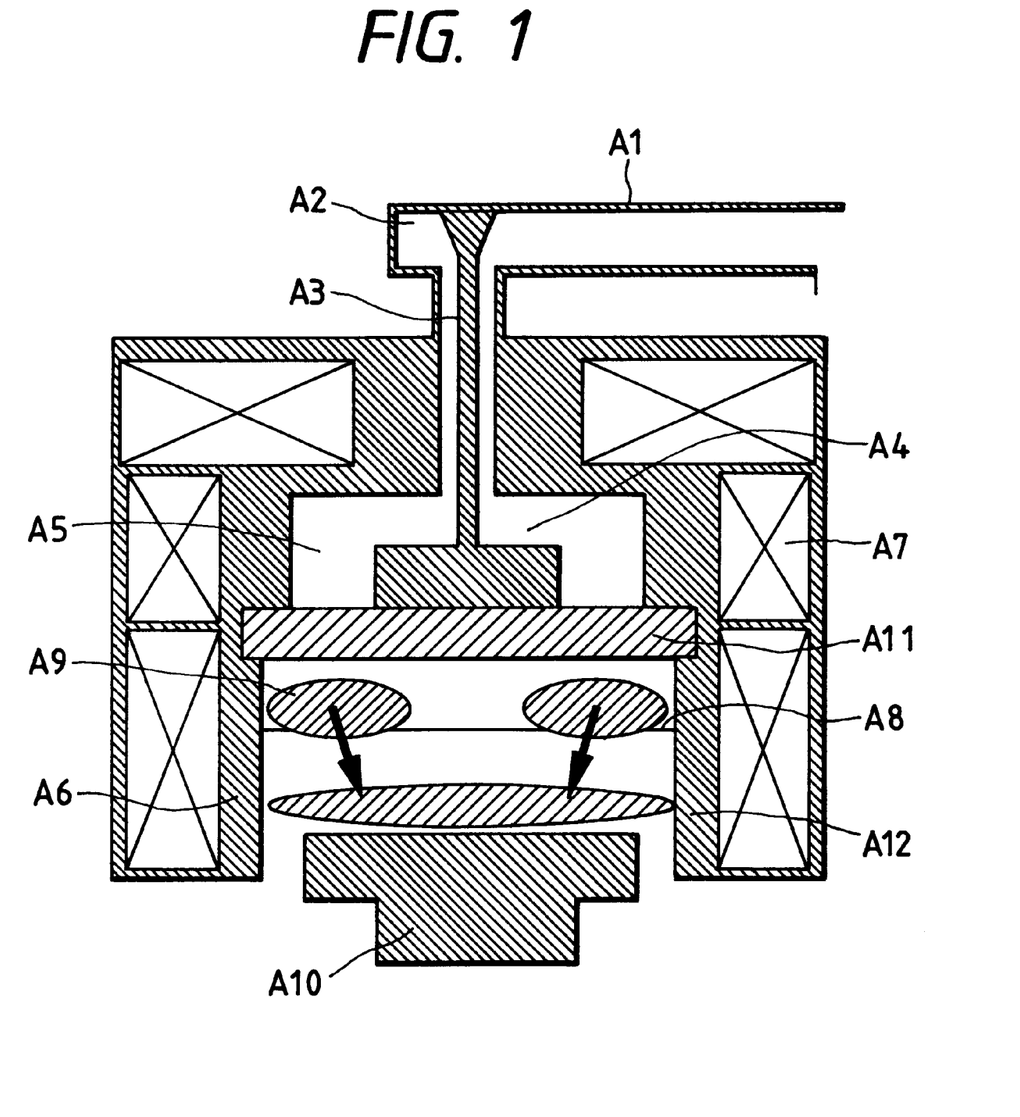
FIG. 1 is a partial front elevational view showing in longitudinal section a first embodiment of the present invention.
Figure 4A:
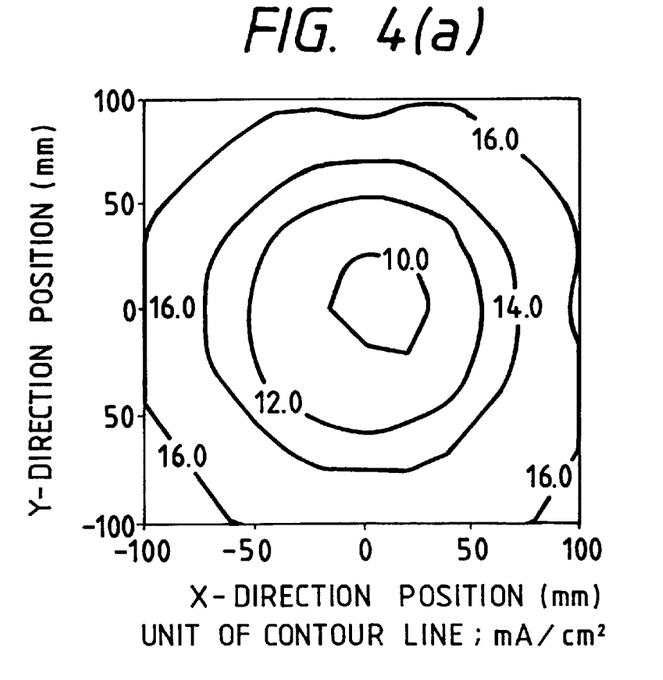
FIGS. 4(a) and 4(b) are graphs showing plasma test results according to the present invention.
Figure 4B:
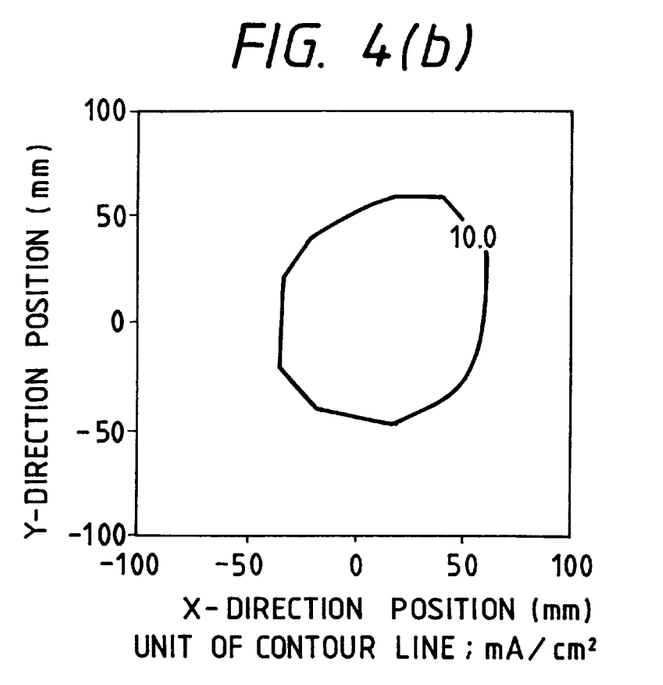

The present invention will be described below by reference to an embodiment. FIG. 1 is a partial front elevational view showing in longitudinal section a plasma processing apparatus according to one embodiment of the present invention. In FIG. 1, a microwave is transmitted through a waveguide A1 and transfers to a coaxial TEM mode in a coaxial waveguide converter A2 before being conducted through a small-diameter coaxial tube A3. The microwave leaves the coaxial tube A3 and transfers to a parallel disk waveguide A4. After having radially enlarged, the microwave transfers to a large-diameter coaxial tube portion A5 and enters a process chamber A6. The process chamber is surrounded by electromagnetic coils A7 for generating static magnetic fields, thus forming an ECR plane A8. A plasma generating portion A9 assumes a ring shape corresponding to this ECR plane and the plasma is uniformized above a wafer installation electrode A10. In FIG. 1, reference numeral A11 denotes a vacuum sealing microwave introducing window which is made of quartz or the like. FIGS. 4(a), 4(b) shows the result obtained by examining the condition in which a plasma is generated under this system. FIGS. 4(a), 4(b) refers to the consequence of two-dimensional distribution measurement on a saturated ion current density (equivalent to a plasma density directly above the wafer) at a position above the electrode (in FIG. 4(a), the ECR plane: 79 mm above the wafer; and in FIG. 4(b), the ECR plane: 99 mm above the wafer), wherein thorough uniformity or concave distribution is seen to become obtainable depending on the magnetic field condition. The current density thus obtained is as high as 10 mA/cm$^2$ or above in the case of a $C_4F_8$ plasma and reaches the equivalent level required. The input microwave power was 1–2 kW and the waveguide was not overheated, for example.

Figure 5:
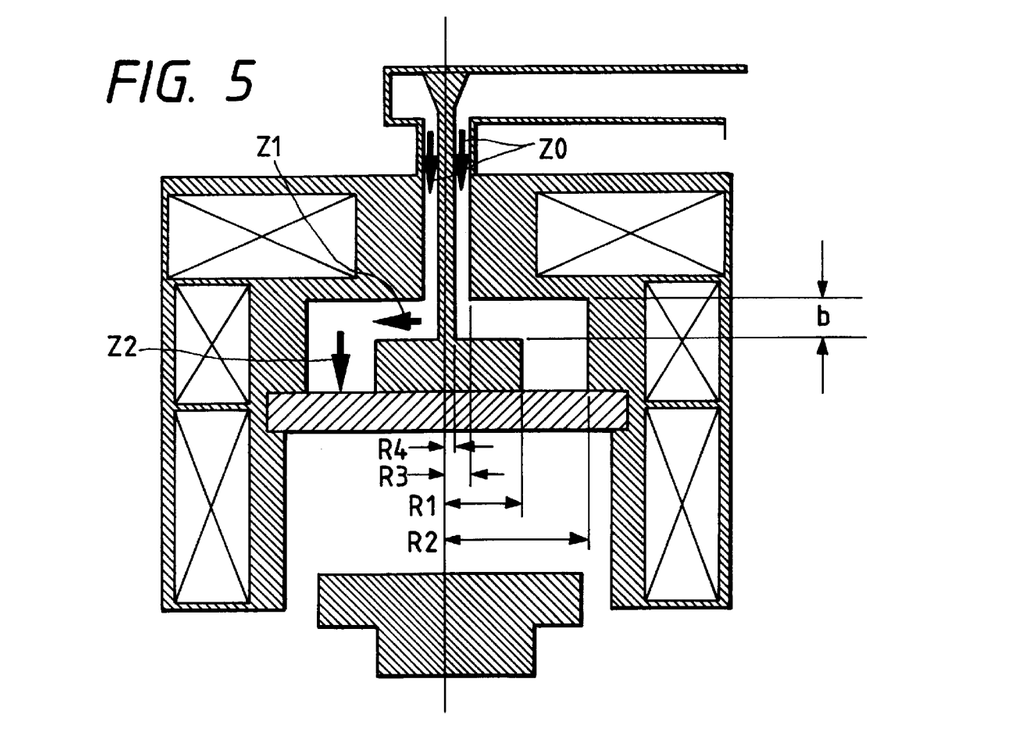
FIG. 5 is a view similar to FIG. 1 showing the dimensional relationship of the present invention.

The dimensional specifications of such a microwave radiator will subsequently be described by reference to FIG. 5. A small-diameter coaxial tube characteristic impedance $Z_0$=50 Ω, a parallel disk impedance $Z_1(R)$ and an enlarged coaxial portion impedance $Z_2$ need to conform to each other so that the reflection of a microwave is prevented from occurring at each junction. The impedance $Z_1$ was newly derived as there was no publicly known document about it. The result is as follows:

$$Z_1(R) = \frac{bZ_0}{2\pi jR} \cdot \frac{Y_0^2(KR)}{Y_1^2(KR)}$$

where b: disk-to-disk distance, R: radial position, $7_0$ =377 Ω, j: imaginary unit, $Y_1^2$: linear Hankel function of the second kind, and K=$2\pi/\lambda$; wave number, input wavelength.

If KR>1, $Z_1(R)$ asymptotically approximates to $$Z_1(R)=Z_0b/2\pi R=60b/R$$

The impedance $Z_2$ of the enlarged coaxial portion is expressed as $$Z_2=60lnR_2/R_1$$

Therefore, the unknowns $R_1$, $R_2$, $R_3$, $R_4$ and b may be determined so that $Z_0=Z_1(R_3)$ and $Z_2=Z_1(R_1)$ are obtained.

Figure 6:
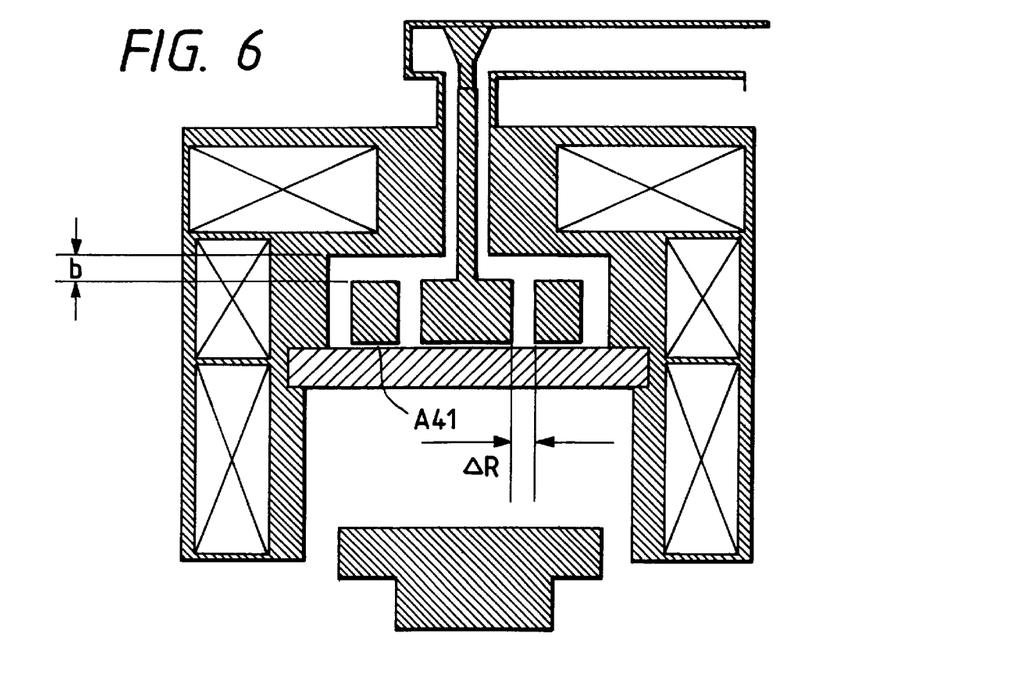
FIG. 6 is a partial front elevational view showing in longitudinal section a second embodiment (1) of the present invention.
Figure 7:
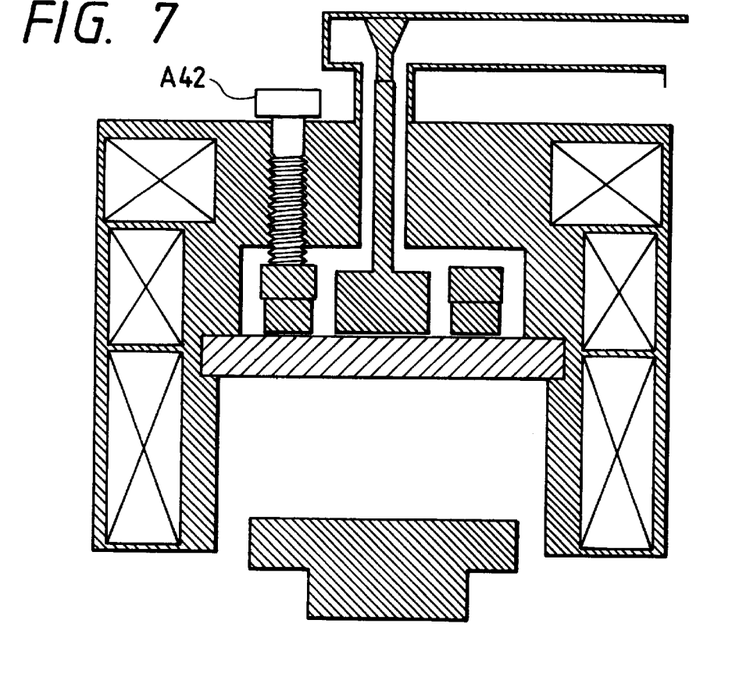
FIG. 7 is a view similar to FIG. 6 showing a another variation of the second embodiment of the present invention.
Figure 8:
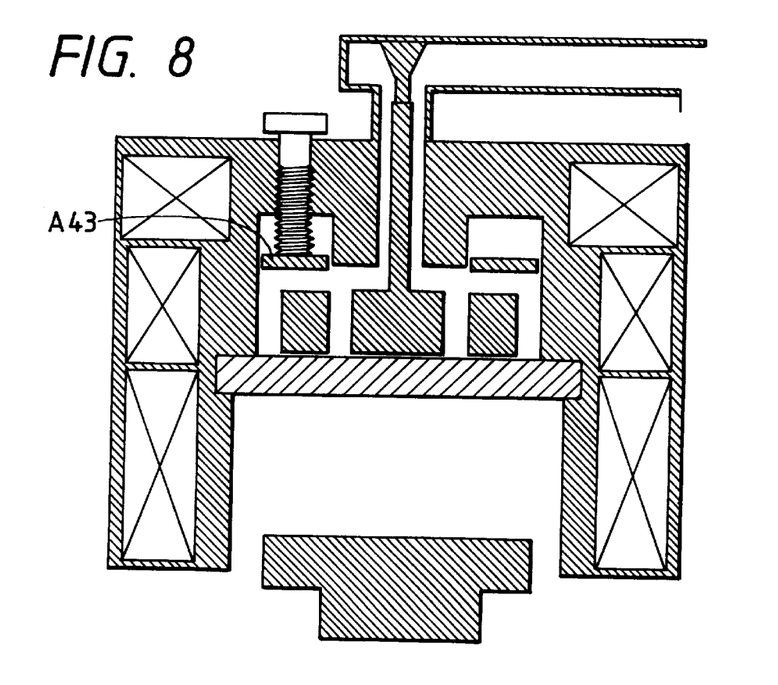
FIG. 8 is a view similar to FIG. 6 showing another variation of the second embodiment (3) of the present invention.

FIG. 6 shows a second embodiment of the present invention. It is desirable that plasma uniformity is made adjustable over the range of perfect uniformity to convex and concave uniformity. This means that the etching uniformity of a specimen to be processed is made controllable by the uniformity of processing gas and a high-frequency bias other than the plasma uniformity and that the plasma uniformity is set to be adjustable so as to cover the influence of any other uniformity determining factor to ensure that final etching uniformity is secured. FIG. 6 shows an arrangement in which the ring radiation part is provided as two rings so that a microwave is emitted from each of the inner and outer peripheral rings. By changing the disk distance b and an opening diameter ΔR of the inner peripheral ring, the distribution of power varies and so does the distribution of the microwave within the process chamber. To change ΔR, a disk component A41 may be replaced. Otherwise, b may be changed by operating a screw mechanism A42 from above, as shown in FIG. 7, or a ceiling member A43 for the parallel disk may be set to be variable by means of a plunger mechanism, as shown in FIG. 8. The system of FIG. 6 makes it necessary to replace the parts each time the uniformity is changed. However, the waveguide is simpler and more reliable than those shown in FIGS. 7 and 8. Although the efficiency of adjusting the uniformity is conversely improved in the examples shown in FIGS. 7 and 8, the movable parts located in the waveguide raises a reliability problem at the time large power is passed therethrough.

Figure 9:
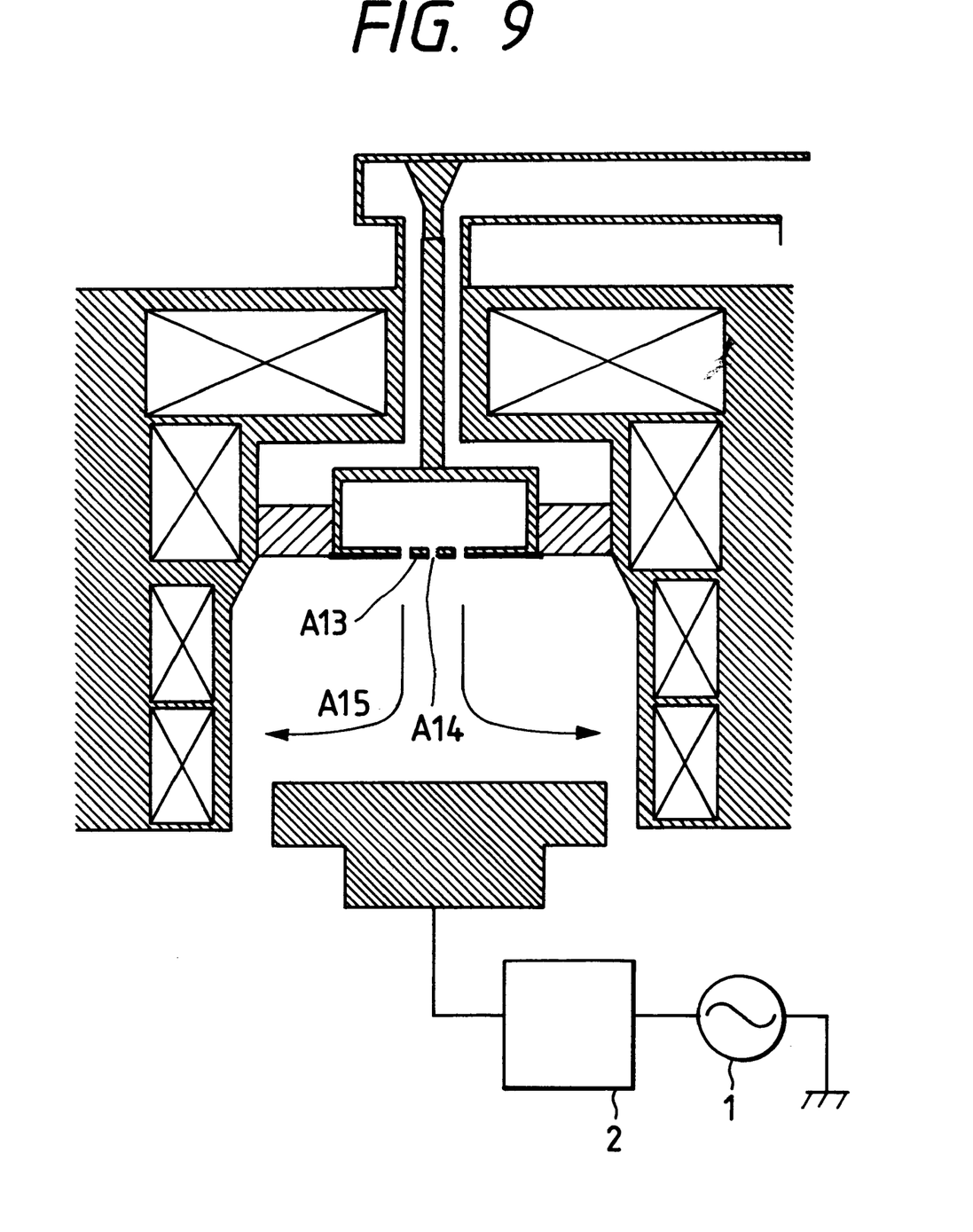
FIG. 9 is a partial front elevational view showing in longitudinal section a third embodiment of the present invention.

FIG. 9 shows a third embodiment of the present invention, wherein an electrically conductive structure (Al or the like) is introduced on the bottom side of the parallel disk facing the process chamber A to form an electrode A13 which is opposed with respect to the wafer. This arrangement is intended to improve the uniformity of high-frequency bias. The use of Si or SiC for a member at this position allows the excess fluorine contained in the plasma to be absorbed, so that the underlying layer (Si) selectivity in an $SiO_2$ etching process is made improvable thereby. A processing gas blowing mechanism A14 using this space is provided according to the present invention in anticipation of processing gas uniformity by utilizing a processing gas flow A15 from the central portion toward the peripheral portion. Moreover, a magnet (coil or permanent magnet) or a magnetic body A16 can be installed in this space and a magnetic-line-of-force structure A17 is also disposed, as shown in FIG. 9, whereby the plasma uniformity can be increased.

Figure 10A:
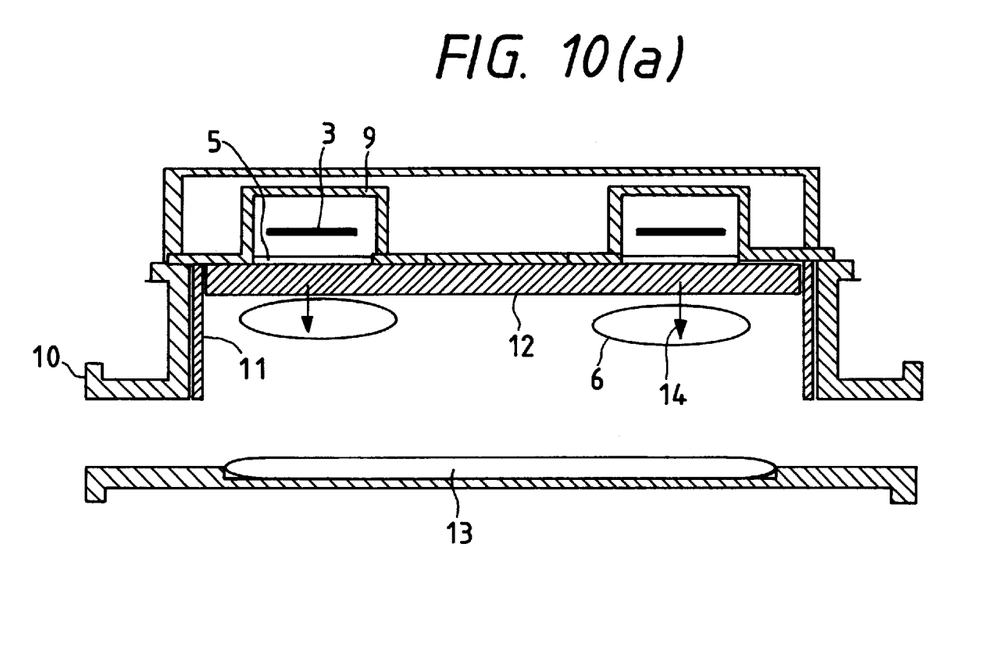
FIG. 10(a) is a side sectional view and FIG. 10(b) is a bottom plan view showing a fourth embodiment of the present invention.
Figure 10B:
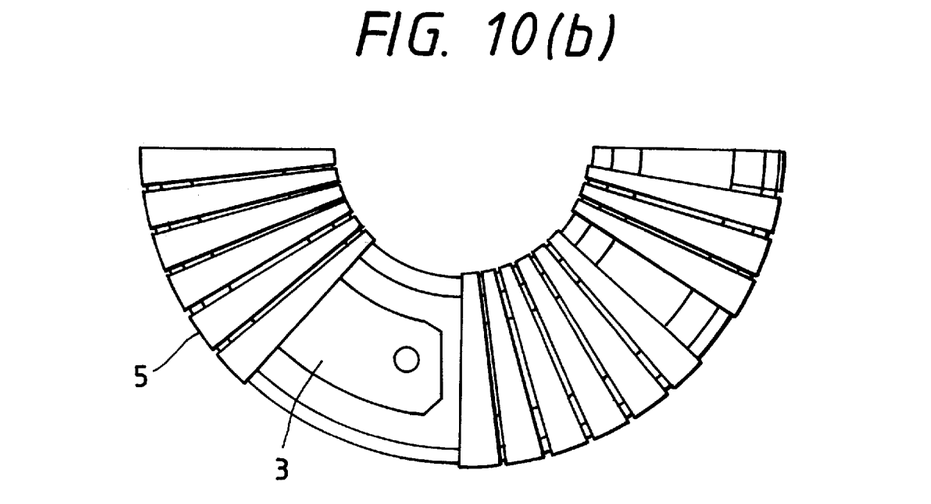

A description will subsequently be given of various examples of a high-frequency plasma system. FIGS. 10(a) and 10(b) show a fourth embodiment of the present invention. In FIG. 10(a), a process chamber 10 comprises a cylindrical side wall 11, a quartz ceiling panel 12 and a specimen-holding stage 13. Ring-shaped antenna modules 9 are placed on the surface of the quartz ceiling panel 12. The antenna module 9 includes a loop antenna 3, a cavity resonator 4, a slit 5 and the like. The radio wave 14 emitted from the cavity resonator 4 is radiated as shown by an arrow of FIG. 10(a), thus causing a plasma 6 to be generated. As the plasma diffuses, it becomes a uniform plasma over the whole surface of a specimen when it reaches the specimen-holding stage 13.

FIG. 10(b) is a bottom plan view taken from under the antenna module 9, wherein part of a double-layer slit 5 is removed to make the antenna body 3 visible.

Figure 11:
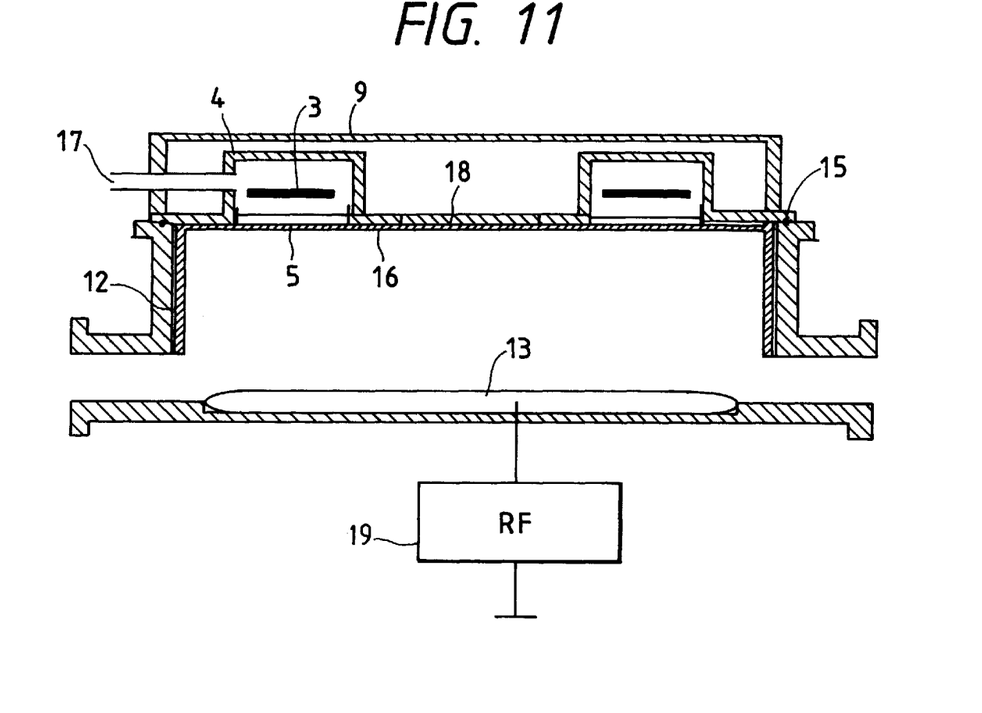
FIG. 11 is a partial front elevational view showing in longitudinal section a fifth embodiment of the present invention.

FIG. 11 shows a fifth embodiment of the present invention. In general, it is preferred for the distance between an antenna module and a plasma to be shorter in the case of an electrode-coupled plasma in view of the ignitability of the plasma. According to the prior art, however, the electrostatically coupled component simultaneously increases, which also poses a problem of abnormal ion acceleration, and consequently the antenna could not be placed near the plasma.

Since an electrostatically coupled component is never generated according to the present invention, the antenna can be set sufficiently close to the plasma and the ignitability can thus be increased. In FIG. 11, the cavity resonator 4 is also used as a vacuum boundary and coupled to the process chamber body 12 with an O-ring 15. A cover 16 (made of quartz, alumina ceramics or sapphire) is fitted to the front of the antenna module lest the plasma is directly exposed to heavy metal. In order to avoid the ignition of the plasma in the cavity resonator in a vacuous condition, an exhaust port 17 is provided separately, and by means of differential exhausting, the cavity resonator is kept under extreme vacuum to prevent discharging therein.

Figure 12:
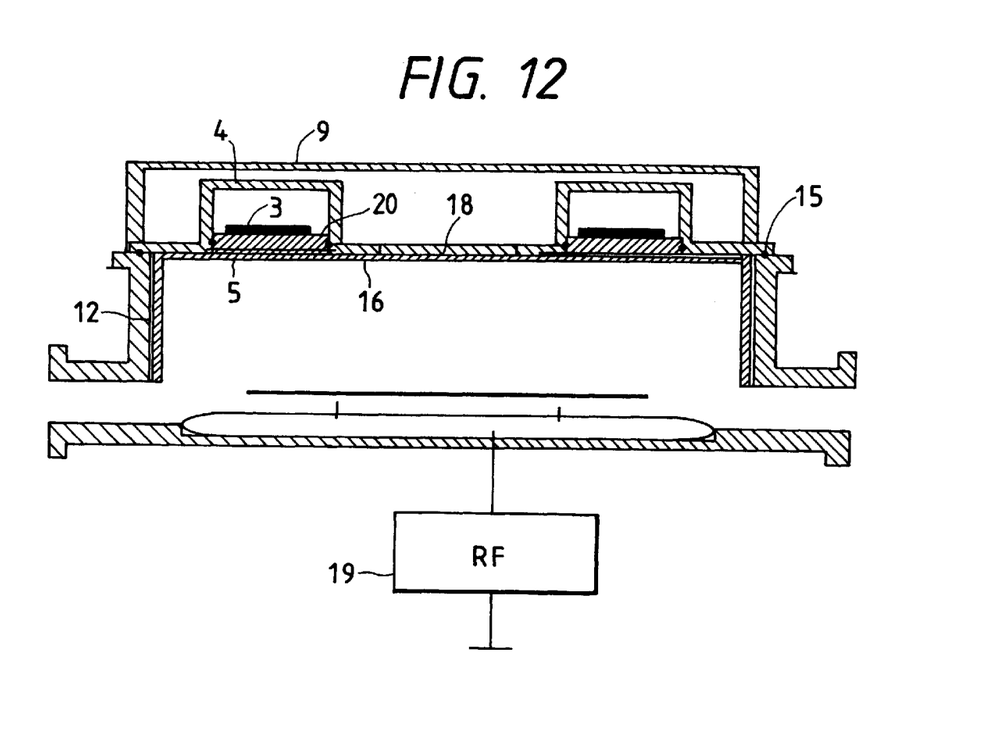
FIG. 12 is a partial front elevational view showing in longitudinal section a sixth embodiment of the present invention.

In the fifth embodiment of the invention, as seen in FIG. 12, other secondary important effects are brought about. When the plasma processing apparatus is applied to etching or a sputter CVD apparatus in general, a high frequency 19 of a system different from what is intended for generating a plasma is applied to the specimen-holding stage to apply self-bias to the specimen so as to draw ions in the plasma onto the surface of a specimen perpendicularly for the purpose of improving the specimen processing accuracy and processing rate. In the prior art, however, the distance between a high-frequency circuit and the center of the specimen through the plasma differs from the distance between the circuit and the end portion of the specimen because a conductor to be used as the opposed grounding electrode of the circuit of the second high frequency 19 forms the inner side wall 12 of the process chamber; consequently, uniformity in processing has been unachievable because the impedance remains unequal. In order to prevent lack of uniformity in processing, it is preferred for a parallel, flat plate-like grounding electrode to be placed opposite to the specimen. However, such an electrode could not be placed in the way stated above in the prior art because the inductively coupled high-frequency plasma intercepted the induced magnetic flux. According to the present invention, the antenna module and the metal ceiling panel 18 of the inner wall of the antenna module face the plasma via a sufficiently thin cover 16, which is capable of functioning as an opposed grounding electrode set in parallel to the whole surface of the specimen, so that processing uniformity is improved. (Regarding the high-frequency circuit, the impedance of a capacitor element will be sufficiently low if the cover 16 is thin. Thus the conductor 18 can be made to function as a grounding electrode. When a high frequency of 13.56 MHz is used as the second high frequency 19, for example, a cover of quartz not greater than 3 mm thick may be satisfactory).

FIG. 12 shows a sixth embodiment of the present invention. According to this embodiment of the present invention, an insulating spacer 20 formed of quartz, alumina ceramics or the like is inserted between the antenna body 3 and an antenna exit 5. This spacer is hermetically fitted with respect to the cavity resonator 4 or sealed under vacuum by means of an O-ring. Consequently, the differential exhausting described with reference to FIG. 3 according to one embodiment of the present invention can be dispensed with and the structure simplified.

According to this embodiment of the invention as noted in the summary of the invention, the antenna which brings about another secondary effect constitutes a constant circuit of distribution and this makes it desirable to lower the impedance of the line with a view toward increasing the current and lowering the voltage because coupling with the plasma is improved by increasing the current and because an abnormal discharge around the antenna is impeded by lowering the voltage. The impedance of the line is determined by the characteristic inductance L and characteristic capacitance C of the line and is given by the following equation:

$$Z=(L+C)^{1/2}$$

Since C is determined by the capacitance between the antenna body 3 and the slit conductor 5, C can be increased and therefore Z can be decreased by setting the antenna body 3 closer to the slit conductor 5 to the extent that discharge breakdown is not caused and the dielectric constant between the antenna body 3 and the slit conductor 5 is increased; a dielectric spacer 20 made of quartz, alumina or the like may preferably be inserted between the antenna body 3 and the slit conductor 5 for this purpose.

Figure 13:
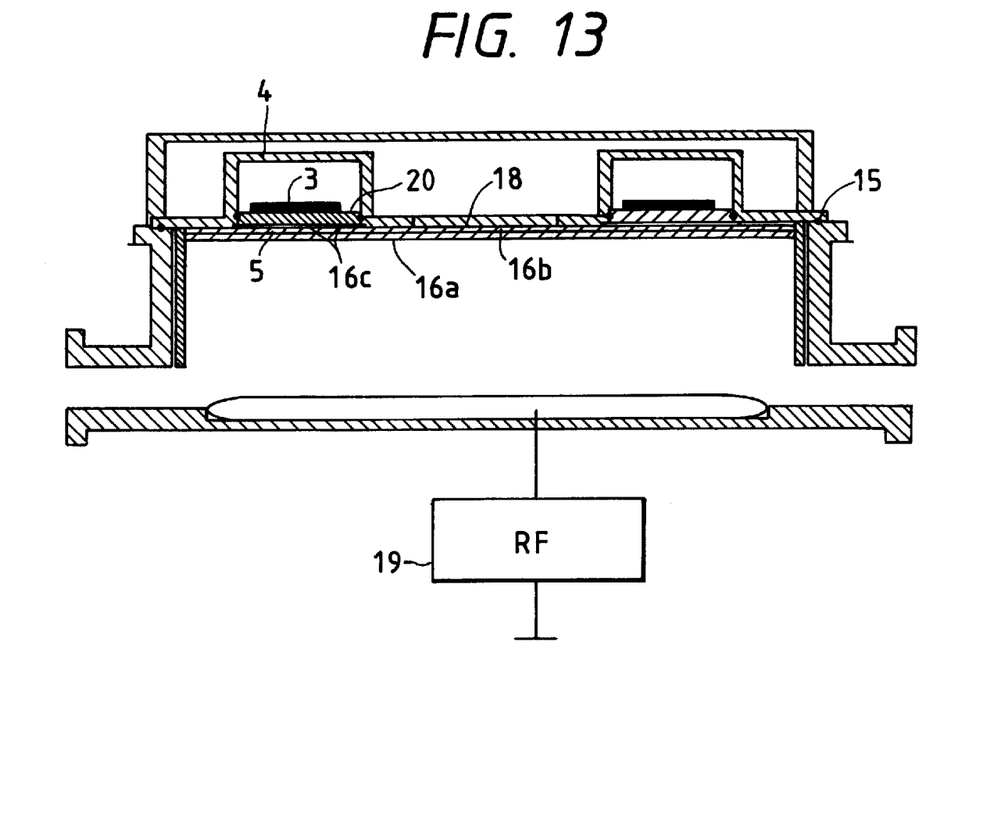
FIG. 13 is a partial front elevational view showing in longitudinal section a seventh embodiment of the present invention.

FIG. 13 shows a seventh embodiment of the present invention. According to this embodiment of the invention, the slit portion 5 of the cavity resonator 4 is replaced with two sheets of cover glass 16a, 16b and Al or Au vapor deposition 16c is utilized for forming a slit pattern on each sheet of cover glass. Thus, the slit conductors in FIGS. 11, 12 can be disused with the effect of not only simplifying the complicated structure shown in FIGS. 11, 12 but also improving the reliability.

Figure 14:
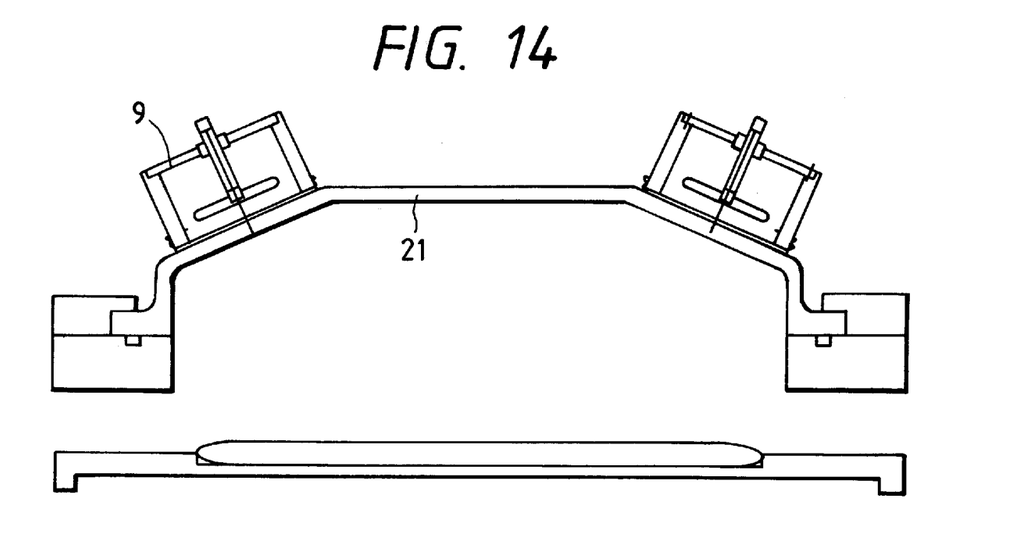
FIG. 14 is a partial front elevational view showing an eighth embodiment of the present invention.

FIG. 14 shows an eighth embodiment of the present invention. According to this embodiment of the invention, the antenna module 9 is mounted on a dome-shaped quartz bell-jar 21. The reason for the use of the dome-shaped bell-jar is that the thickness of such a bell-jar can be reduced in view of the inherent structural strength thereof. The adoption of such a thin-walled bell-jar results in improved ignitability of the plasma inasmuch as the coupling of the plasma with the antenna module is enhanced.

Figure 15:
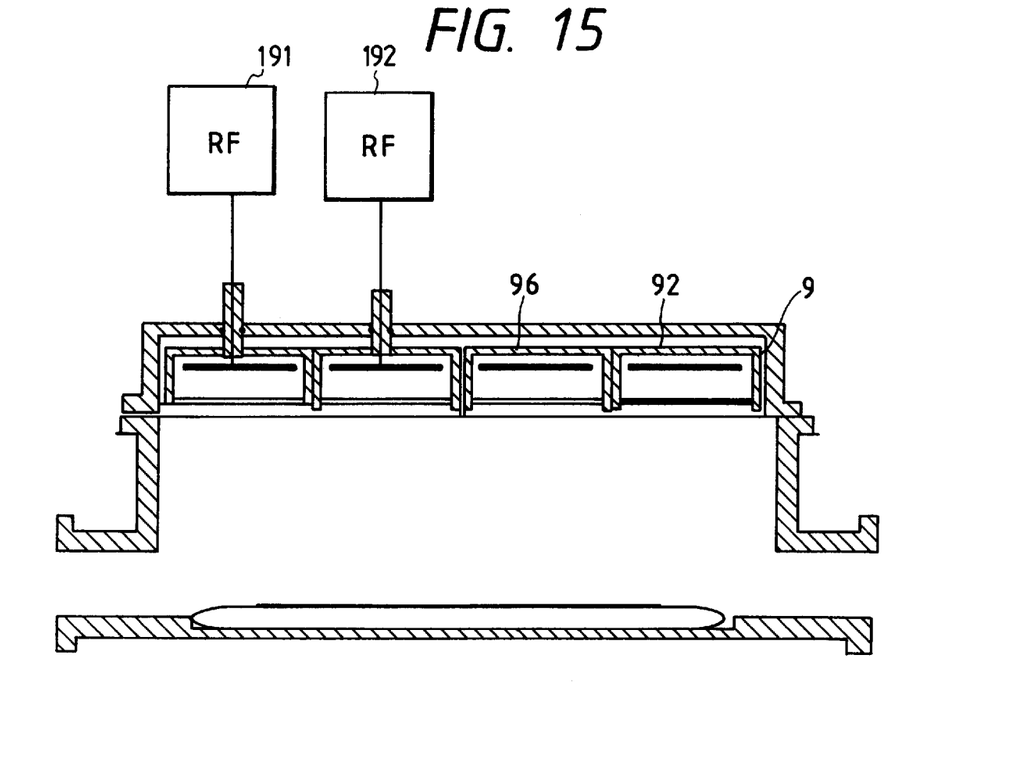
FIG. 15 is a partial front elevational view showing in longitudinal section a ninth embodiment of the present invention.

According to the ninth embodiment shown in FIG. 15, two antenna modules 9 are arranged in the form of concentric circles and are respectively connected to high-frequency sources of different systems. The levels of currents flowing into antennas 92, 96 and the relative phases are controlled by the high-frequency sources 191, 192 for driving the respective antennas, whereby the distribution of the quantity of ions reaching a specimen can be regulated since the position where the plasma is generated is controllable.

Figure 16:
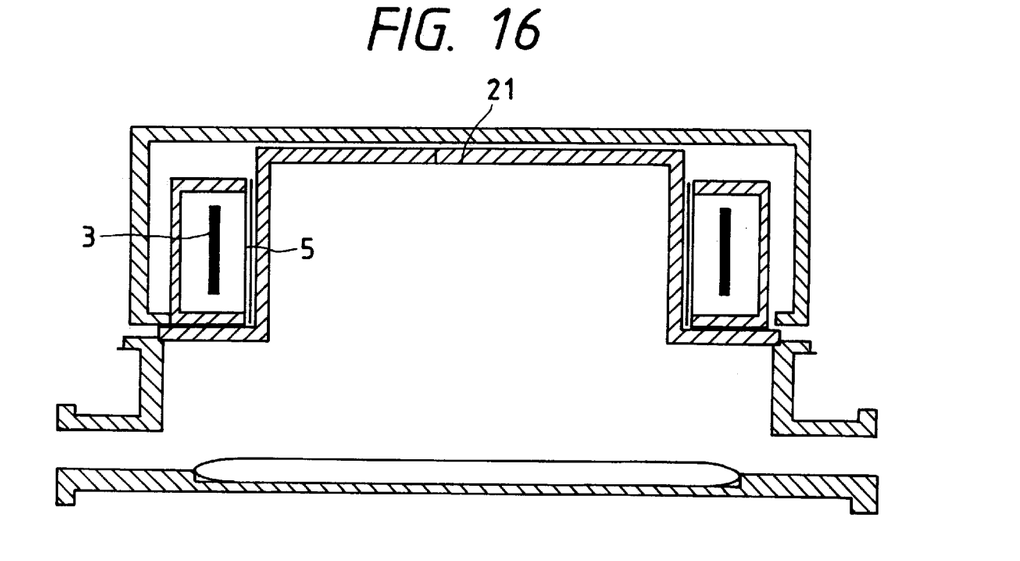
FIG. 16 is a partial front elevational view showing in longitudinal section a tenth embodiment of the present invention.

According to a tenth embodiment, as shown in FIG. 16, a quartz bell-jar 21 in the shape of a hat is provided and the antenna module is installed on the side of the bell-jar. By forming the bell-jar into a hat shape, the wall thickness of at least the side portion of the bell-jar can be reduced with the effect of improving the coupling with the plasma.

As set forth above, according to the present invention, it is possible to provide a method and apparatus capable of meeting various requirements (plasma uniformity, uniformity controllability, the provision of opposed grounding electrodes and so on) of the plasma processing chamber, which is simple in construction.

According to the present invention, further, (1) abnormal discharge and sputtering resulting from the electrostatic coupling of the plasma with the antenna are obviated, which contributes to decreasing the amount of foreign matter and improving long-term reliability;
(2) ignitability and stability of discharge are improvable since the antenna can be placed closer to the plasma;
(3) abnormal discharge coupling originating from high antenna voltage can be obviated with increased stability as well by easily ensuring matching since the antenna impedance can be lowered; and
(4) a grounding electrode can be formed in parallel to the specimen since a conductor is placeable even in the space surrounded by the antenna module, so that processing uniformity is improved.

What is claimed is:

1. A plasma processing apparatus, comprising:
a microwave introducing device;
a magnetic field coil for generating a vertical static magnetic field;
a process chamber for generating a plasma using an introduced microwave;
a gas supplying device for supplying a gas to said process chamber;
a specimen stage for holding a wafer; and
a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;
characterized in that $R_1$, $R_2$, $R_3$, $R_4$ and b are selected so that a small-diameter coaxial waveguide characteristic impedance $Z_0(=60 \ln(R_3/R_4))$, $R_3$: in-coaxial-tube conductor radius, $R_4$: out-of-coaxial-tube conductor radius) of said small-diameter coaxial waveguide coincides with an impedance $Z_1$ ($=60b/R_3$, b: parallel disk distance) of said disk-shaped waveguide at a junction with said disk-shaped waveguide, and so that an enlarged coaxial waveguide impedance $Z_2$ ($=60 \ln(R_2/R_1)$), $R_2$: out-of-coaxial-tube conductor radius, $R_1$: in-coaxial-tube conductor radius) coincides with an impedance $Z_1(=60b/R_1)$ of said disk-shaped waveguide at a junction with said disk-shaped waveguide.

2. A plasma processing apparatus, comprising:
a microwave introducing device;
a magnetic field coil for generating a vertical static magnetic field;
a process chamber for generating a plasma using an introduced microwave;
a gas supplying device for supplying a gas to said process chamber;
a specimen stage for holding a wafer; and
a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;
characterized in that said microwave is produced by a plurality of microwave sources of different frequencies at the same time.

3. A plasma processing apparatus, comprising:
a microwave introducing device;
a magnetic field coil for generating a vertical static magnetic field;
a process chamber for generating a plasma using an introduced microwave;
a gas supplying device for supplying a gas to said process chamber;
a specimen stage for holding a wafer; and
a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;
characterized in that said microwave introducing vacuum window includes a vacuum window portion whose plasma contact portion which is within a portion other than a portion ($R_1<R<R_2$) equivalent to a microwave radiating part is provided with a grounding conductor plate or a semiconductor plate, such as Si or SiC.

4. A plasma processing apparatus, comprising:

a microwave introducing device;

a magnetic field coil for generating a vertical static magnetic field;

a process chamber for generating a plasma using an introduced microwave;

a gas supplying device for supplying a gas to said process chamber;

a specimen stage for holding a wafer; and a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;

characterized in that said microwave introducing vacuum window includes a vacuum window portion in which processing gas introducing means is provided by utilizing a portion other than a portion ($R_1 < R < R_2$) equivalent to a microwave radiating part.

5. A plasma processing apparatus, comprising:

a microwave introducing device;

a magnetic field coil for generating a vertical static magnetic field;

a process chamber for generating a plasma using an introduced microwave;

a gas supplying device for supplying a gas to said process chamber;

a specimen stage for holding a wafer; and a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;

characterized in that said microwave introducing vacuum window includes a magnetic field coil or a permanent magnet which is provided by utilizing a portion other than a portion ($R_1 < R < R_2$) equivalent to a microwave radiating part.

6. A plasma processing apparatus, comprising:

a microwave introducing device;

a magnetic field coil for generating a vertical static magnetic field;

a process chamber for generating a plasma using an introduced microwave;

a gas supplying device for supplying a gas to said process chamber;

a specimen stage for holding a wafer; and a vacuum evacuating device for evacuating said process chamber, characterized in that said microwave introducing device is equipped with a coaxial waveguide converter, a small-diameter waveguide, a discoid parallel-plate flat disk-shaped waveguide, an enlarged coaxial waveguide and a microwave introducing vacuum window;

characterized in that said discoid parallel-plate waveguide includes a small and a large ring-shaped opening portion and said enlarged coaxial waveguide is connected to each of said opening portions.

7. An electromagnetically coupled plasma processing apparatus, comprising a process chamber, specimen holding means, means for introducing gas into the process chamber and plasma generating means, further including:

a loop antenna for carrying a high-frequency wave, a cavity resonator so arranged as to surround the loop antenna, and an antenna module which has a slit and is situated in a position where the cavity resonator faces a plasma;

characterized in that a spacer formed of dielectric material is inserted between the loop antenna and the slit conductor in the antenna module.

8. An electromagnetically coupled plasma processing apparatus according to claim 7, characterized in that gas in the interior of the antenna module is differentially discharged and that the antenna module is so structured as to include a thin dielectric material installed on the boundary between the antenna module and the process chamber, and a grounding conductor installed in the ring of a ring-shaped antenna module, whereby a second high-frequency wave can be applied to the specimen-holding stage.

9. An electromagnetically coupled plasma processing apparatus according to claim 7, characterized in that two systems of antenna modules are arranged in the form of a concentric circle and that the antenna modules are connected to different high-frequency sources respectively.

10. An electromagnetically coupled plasma processing apparatus according to claim 7, characterized in that a bell-jar in the shape of a silk hat is employed as the process chamber and that the antenna module is located on the side of the bell-jar.

11. An electromagnetically coupled plasma processing apparatus, comprising a process chamber, specimen holding means, means for introducing gas into the process chamber and plasma generating means, further including:

a loop antenna for carrying a high-frequency wave, a cavity resonator so arranged as to surround the loop antenna, and an antenna module which has a slit and is situated in a position where the cavity resonator faces a plasma, characterized in that a plurality of linear antenna modules are employed as the antenna module; and characterized in that in place of the slit conductor, a double-layer structure prepared by stacking two sheets of thin dielectric materials each with slit patterns formed by metal vapor deposition is employed and that the joint between the spacer and the cavity resonator is sealed by means of an O-ring.

* * * * *